(12) United States Patent
    Park

(10) Patent No.: US 7,375,024 B2
(45) Date of Patent: May 20, 2008

(54) METHOD FOR FABRICATING METAL INTERCONNECTION LINE WITH USE OF BARRIER METAL LAYER FORMED IN LOW TEMPERATURE

(75) Inventor: Chang-Soo Park, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 188 days.

(21) Appl. No.: 11/029,758

(22) Filed: Dec. 22, 2004

(65) Prior Publication Data
    US 2005/0250314 A1    Nov. 10, 2005

(30) Foreign Application Priority Data
    May 10, 2004    (KR)    ........................ 10-2004-0032847

(51) Int. Cl.
    *H01L 21/4763*    (2006.01)
(52) U.S. Cl. ...................... 438/627; 438/658; 438/677; 257/E21.169; 257/E21.483
(58) Field of Classification Search ................ 438/658, 438/644, 677, 627; 257/E21.169, E21.483, 257/E21.584, E21.591, E21.593
    See application file for complete search history.

(56) References Cited

U.S. PATENT DOCUMENTS

| | | | |
|---|---|---|---|
| 5,916,365 A * | 6/1999 | Sherman | 117/92 |
| 6,139,700 A * | 10/2000 | Kang et al. | 204/192.17 |
| 6,720,027 B2 * | 4/2004 | Yang et al. | 427/123 |
| 6,861,356 B2 * | 3/2005 | Matsuse et al. | 438/653 |
| 6,902,763 B1 * | 6/2005 | Elers et al. | 427/250 |
| 2001/0017416 A1 * | 8/2001 | Sengupta et al. | 257/751 |
| 2002/0058408 A1 * | 5/2002 | Maydan et al. | 438/637 |
| 2003/0194858 A1 * | 10/2003 | Lee et al. | 438/643 |
| 2004/0013803 A1 * | 1/2004 | Chung et al. | 427/255.391 |
| 2004/0053491 A1 * | 3/2004 | Park et al. | 438/637 |
| 2005/0009325 A1 * | 1/2005 | Chung et al. | 438/637 |

FOREIGN PATENT DOCUMENTS

| | | |
|---|---|---|
| KR | 1999-017335 | 3/1999 |
| KR | 10-0266871 | 6/2000 |
| KR | 2003-0001103 | 6/2003 |

\* cited by examiner

*Primary Examiner*—Caridad Everhart
(74) *Attorney, Agent, or Firm*—Blakely, Sokoloff, Taylor & Zafman

(57) ABSTRACT

The present invention relates to a method for fabricating a metal interconnection line with use of a barrier metal layer formed in a low temperature. The method includes the steps of: forming an inter-layer insulation layer on a substrate; etching predetermined regions of the inter-layer insulation layer to form a plurality of contact openings; forming an ohmic metal layer on the contact openings and the etched inter-layer insulation layer; forming a seed layer on the ohmic metal layer; forming a metal layer on the seed layer and nitriding the metal layer in a repeated number of times to form a barrier metal layer; and forming a metal interconnection line on the barrier metal layer by burying the contact openings.

19 Claims, 10 Drawing Sheets

Aspect Ratio=7.5 (CD=0.3μm)

METHOD FOR FABRICATING METAL INTERCONNECTION LINE WITH USE OF BARRIER METAL LAYER FORMED IN LOW TEMPERATURE

FIELD OF THE INVENTION

The present invention relates to a method for fabricating a semiconductor device; and more particularly, to a method for fabricating a metal interconnection line by using a barrier metal layer formed in a low temperature.

DESCRIPTION OF RELATED ARTS

A large scale of integration of a semiconductor device has led to a continuous decrease in the design rule, and thus, it is also required to develop an appropriate technology for filling a contact hole or a via hole having a high height and a size of sub-half microns in order to secure reliability of semiconductor devices and realize the mass production. This technology for filling the contact hole or the via hole has a great impact on an overall process of multiple metal interconnection lines formation.

For the technology for filling the contact hole or the via hole, the most commonly used method is to fill a contact hole with a tungsten layer formed by a blanket deposition method and then perform a chemical mechanical polishing (CMP) process to the tungsten layer.

FIGS. 1A and 1B are cross-sectional views illustrating a conventional method for filling a tungsten layer into a contact opening by using a blanket deposition method.

Referring to FIG. 1A, an insulation layer 12 is formed on a substrate 11 and then, etched to form a contact opening 13. An adhesion layer based on metal nitrides is formed on the insulation layer 12 for the purpose of securing a low contact resistance and an adhesion with an oxide layer. Herein, for the adhesion layer, a titanium (Ti) layer 14 and a titanium nitride layer 15 are formed. A tungsten (W) layer 16 is formed on the titanium nitride layer 15 such that the tungsten layer 16 is sufficiently filled into the contact opening 13. At this time, a chemical vapor deposition (CVD) method having a good step-coverage characteristic is employed. Also, the tungsten layer 16 is formed in a thickness greater than a radius of the contact opening 13.

Referring to FIG. 1B, the tungsten layer 16, the titanium nitride layer 15 and the titanium layer 14 are removed through a dry etching process or a CMP process performed until the tungsten layer 16 remain only within the contact opening 13. Afterwards, a wet cleaning process is performed to remove particles of metal remnants remaining on a surface of the above resulting substrate structure.

However, the above conventional method should be carried out in multiple steps with use of different apparatuses. Thus, this conventional method is disadvantageous that a total cost for forming a blanket tungsten layer is very high and yields of semiconductor devices are low because of an elongated processing time.

For this reason, another method for forming a selective tungsten layer within a contact opening is suggested. Unlike the above conventional method for forming the blanket tungsten layer, the selective tungsten layer formation method is a method of selectively forming plugs in a different growth rate depending on bottom interconnection line materials exposed inside contact openings such as pure metals, metal silicide and N/P+ Silicon. Particularly, the selective tungsten layer formation method uses the fact that, when forming at least more than two interconnection lines connected through a via hole without forming an adhesion layer, a bottom metal layer exposed by the via hole connecting the interconnection lines, single crystal/polycrystal silicon and an insulation layer formed in sidewalls of the via hole, e.g., a silicon oxide layer, have different deposition characteristics.

FIG. 2 is a cross-sectional view of a plug formed by employing a conventional selective tungsten layer formation method.

As shown, an insulation layer 22 is formed on a bottom interconnection line 21 and then, etched to form a contact opening 23 exposing the bottom interconnection line 21. A tungsten plug 24 filling into the contact opening 23 is formed by using a difference in a selective deposition characteristic between the bottom interconnection line 21 and the insulation layer 22 which becomes sidewalls of the contact opening 23.

However, according to the selective tungsten layer formation method, the tungsten plug 24 grows upwardly from a bottom surface of the contact opening 23, but the growth of the tungsten layer 24 formed within the contact opening 23 continues, so that the tungsten layer 24 overflows to side regions. In this case, similar to the blanket tungsten layer formation method, a CMP process is employed to remove the overflowed portion of the tungsten plug 24, and a wet cleaning process is performed thereafter.

Also, if the bottom interconnection line 21 is a silicon substrate, the tungsten plug 24 disposed on a portion of the silicon substrate 21 exposed by the contact opening 23 grows and diffuses toward the silicon substrate 21, thereby forming wormholes which result in leakage currents and subsequently defective devices. As a result, this selective tungsten layer formation method is limitedly used for the case of filling the contact openings formed on at least more two interconnection line structures.

Furthermore, because of a difference in the selective deposition characteristics between a material for forming the sidewalls of the contact opening and the bottom interconnection line, a gap is formed between the selectively formed tungsten plug and the sidewalls of the contact opening, thereby resulting in a poor morphology and a decrease in reliability of a top interconnection line caused by the overflowed tungsten.

FIG. 3 is a cross-sectional view of a conventional metal plug filled into a contact opening by employing a chemical vapor deposition method.

As shown, an insulation layer 33 is formed on a silicon-based substrate 31 provided with an impurity layer and is then etched to form a contact opening 34. A titanium layer 35 and a titanium nitride layer 36 are formed on the above resulting substrate structure.

Next, a copper (Cu) layer 37 is formed on the titanium nitride layer 36, and a metal layer 38 based on such a material as aluminum, titanium and tantalum is formed on the copper layer 37 disposed on non-etched portions of the insulation layer 33 by employing a physical vapor deposition (PVD) method, that is, a sputtering method.

Afterwards, the metal layer 38 is oxidized through an exposure to the atmosphere, or through the use of oxygen plasma, thereby forming a metal deposition barrier layer 39.

A metal liner 40 is formed selectively on an exposed portion of the copper layer 37. Then, a metal plug 41 that fills a region encompassed by the metal liner 40 is formed by employing a metal-organic chemical vapor deposition (MOCVD) method. Herein, the metal plug 41 is made of aluminum.

However, if a height of the contact opening increases while a diameter of the contact opening decreases abruptly, one disadvantage of using a sputtering method such as an ion metal plasma (IMP) method, a long through sputtering (LTS) method or a collimated sputtering method for forming the titanium nitride layer 36 which is a barrier metal layer is pronounced. That is, a directivity of a deposited material increases, and thus, a step-coverage capability increases at a bottom of the contact opening 34 but decreases at sidewalls of the contact opening 34, and as a result, a nucleus generation necessary for forming the metal plug 41 does not occur at the sidewalls of the contact opening 34. In this case, the metal plug 41 is formed at a bottom surface of the contact opening 34 and grows upwardly, and if the height of the contact opening 34 is low, as similar to the selective tungsten layer formation method, the metal plug 41 overflows to side regions, or if the height of the contact opening 34 is high, a period for forming the metal plug 41 is elongated. Also, since the metal deposition barrier layer 39 is formed above a portion of the barrier metal layer 36 through a predetermined oxidization process, the metal plug 41 does not grow on the metal deposition barrier layer 39.

FIG. 4A is a diagram showing a step-coverage characteristic when a barrier metal layer made of titanium nitride (TiN) is deposited on a contact opening of which height is high, e.g., an aspect ratio of approximately 7.5, by employing an IMP method, which is one of physical deposition methods capable of improving a step-coverage characteristic at a bottom surface of the contact opening through increasing directionality.

Meanwhile, FIG. 4B is a diagram showing a step-coverage characteristic when a metal layer is formed on a barrier metal layer through performing a CVD method. In this case, the barrier metal layer is made of titanium and is deposited on a contact opening of which height is low, e.g., an aspect ratio of approximately 2.5, by employing an IMP method.

Referring to FIG. 4A, approximately 50% of a thickness of the barrier metal layer is discovered at a bottom part of the contact opening. However, at sidewalls of the contact opening, there is hardly seen the barrier metal layer. A difference in the thickness of the barrier metal layer at the bottom part and at the sidewalls accelerates a difference in time taken for initially generating nuclei in the course of depositing a tungsten layer after the barrier metal layer is exposed to the air. The reason for this result is because of a greatly varying oxygen amount in the thin barrier metal layer obtained by a natural oxidization reaction as the density of the barrier metal layer varies depending on these different thicknesses when the barrier metal layer is exposed to the air.

That is, the thickness of the barrier metal layer decreases as being measured from an inlet of the contact opening to the sidewalls of the contact opening, and this decrease in the thickness become pronounced when the aspect ration increases. As a result of this decreased thickness of the barrier metal layer, a thickness of the tungsten layer decreases as going down to the bottom part of the contact opening. This result is also shown in FIG. 4B in which the tungsten layer is formed on the barrier metal layer deposited on the contact opening having low aspect ratio. Since the deposition proceeds rapidly at the inlet and the surface of the contact opening, a protrusion is generated at the inlet, thereby creating gaps in the tungsten layer for use in a plug.

To solve the above described disadvantages, it is proposed to form a barrier metal layer based on a material such as titanium nitride by employing a CVD method having a good step-coverage property.

However, since the titanium nitride layer deposition proceeds in a high temperature and an inorganic compound such as titanium tetrachloride ($TiCl_4$) is used as a source gas, titanium employed for decreasing a contact resistance at a bottom part of a contact opening reacts excessively with a silicon substrate as the deposition temperature of the titanium nitride becomes high. This excessive reaction between the titanium and the silicon substrate results in an increase in leakage currents, thereby further generating defects in devices.

Also, if corrosive elements like chlorine (Cl) remain within the barrier metal layer, a metal plug and an interconnection line become corroded, thereby resulting in an electrical disconnection, which further creating defective devices.

In case of employing a CVD or MOCVD method with use of metal organic materials, it is possible to proceed the deposition in a low temperature; however, resistivity increases because of carbon containing impurities remaining inside of a deposited layer and a step-coverage characteristic becomes deteriorated at sidewalls and a bottom part of a contact opening. Particularly, in case that copper is used for forming a metal interconnection line, a barrier metal layer for preventing diffusion of copper is formed with a greater thickness in comparison with the case of employing an aluminum plug along with use of a CVD method. In case of employing tantalum nitride, which has a better barrier characteristic against copper but has a higher resistivity than titanium nitride, as the barrier metal material, an effect on improved resistance of the interconnection lines obtained by using copper as an interconnection line material is severely diminished. For instance, if a width of the interconnection line is 0.2 µm, a method for forming a copper interconnection line with use of a single damascene process has a decreased resistance of the interconnection line by 11% compared with a dual damascene process that fills the contact opening and forms the interconnection line simultaneously. Particularly, in comparison with the single damascene process, in order to prevent the diffusion of copper, the barrier metal layer is formed thickly when the dual damascene process is employed because of an increased aspect ratio. Because of highly diffusible characteristic, the copper diffuses to an inner side of a silicon-based substrate even at a low temperature of 200° C. if the barrier metal layer is thinly formed on the silicon-based substrate, thereby forming a deep level trap in the form of a compound of copper and silicon which further degrades device characteristics.

For this reason, the single damascene process is more frequently employed to fill the contact opening with aluminum through the use of a conventional blanket tungsten layer formation method or an etch-back process and subsequently to form a copper interconnection line. Also, in case of using aluminum through the use of a CVD method, nuclei are not generated uniformly at the substrate obtained by applying a PVD method, or at a barrier metal layer deposited by using an organic compound. This non-uniform generation of the nuclei results in a rough surface. Even though the CVD method and the PVD method are consecutively performed without being exposed to the air in order to solve the above problem, it may still be difficult to form a plug due to a poor step-coverage characteristic at sidewalls of the contact opening of which height is high. Thus, in order to lower the deposition temperature which is the problem of the CVD method, another method of employing both of an atomic layer deposition method and a plasma has been proposed; however, this proposed method may still be disadvantageous by requiring the use of new apparatuses for carrying out this proposed method, and this fact may adversely increase manufacturing costs.

SUMMARY OF THE INVENTION

It is, therefore, an object of the present invention to provide a method for fabricating a metal interconnection line in a semiconductor device capable of securing a desired step-coverage characteristic of a barrier metal layer as simultaneously as of forming the barrier metal layer in a low temperature.

In accordance with an aspect of the present invention, there is provided a method for fabricating a metal interconnection line in a semiconductor device, including the steps of: forming an inter-layer insulation layer on a substrate; etching predetermined regions of the inter-layer insulation layer to form a plurality of contact openings; forming an ohmic metal layer on the contact openings and the etched inter-layer insulation layer; forming a seed layer on the ohmic metal layer; forming a metal layer on the seed layer and nitriding the metal layer in a repeated number of times to form a barrier metal layer; and forming a metal interconnection line on the barrier metal layer by burying the contact openings.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A method for fabricating a metal interconnection line with use of a barrier metal layer formed in a low temperature in accordance with preferred embodiments of the present invention will be described in detail with reference to the accompanying drawings.

FIGS. 5A to 5G are cross-sectional views illustrating a method for forming a metal interconnection line in accordance with a first embodiment of the present invention.

Figure 1A:
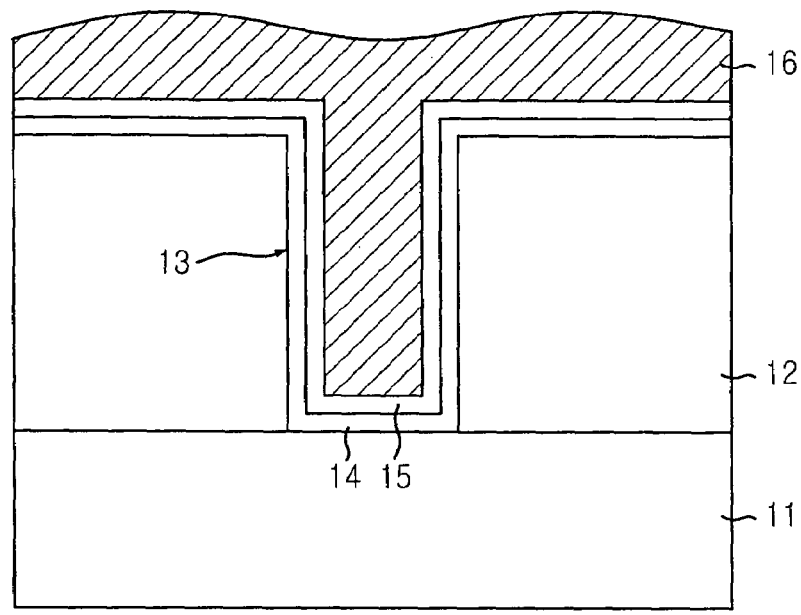
FIGS. 1A and 1B are cross-sectional views illustrating a conventional method for forming a tungsten plug by using a blanket deposition method.
Figure 1B:
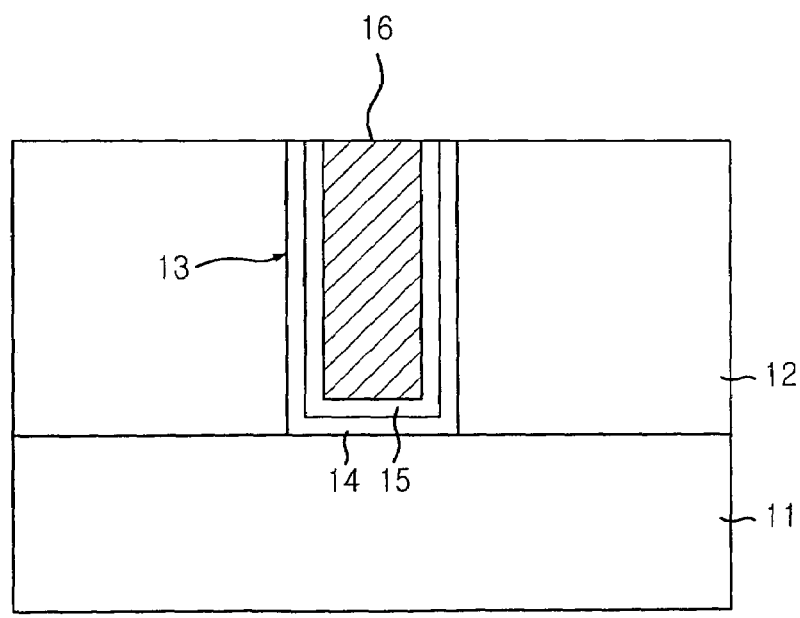
Figure 2:
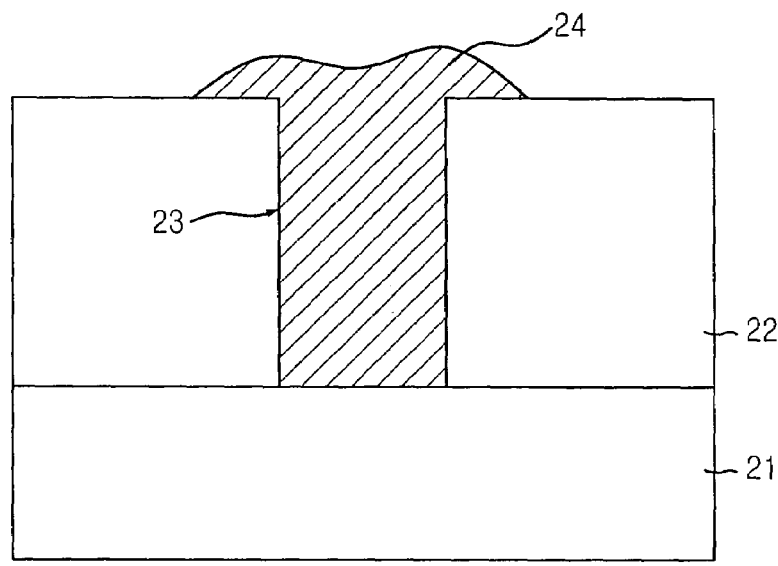
FIG. 2 is a cross-sectional view briefly showing a tungsten plug formed by employing a conventional selective tungsten layer formation method.
Figure 3:
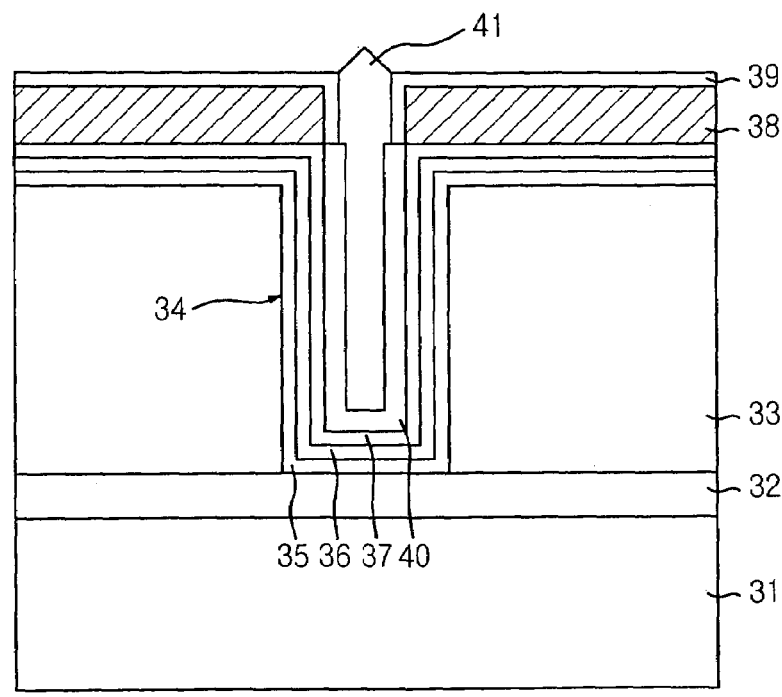
FIG. 3 is a cross-sectional view illustrating a conventional method for filling a contact opening by employing a chemical vapor deposition (CVD) method.
Figure 4A:
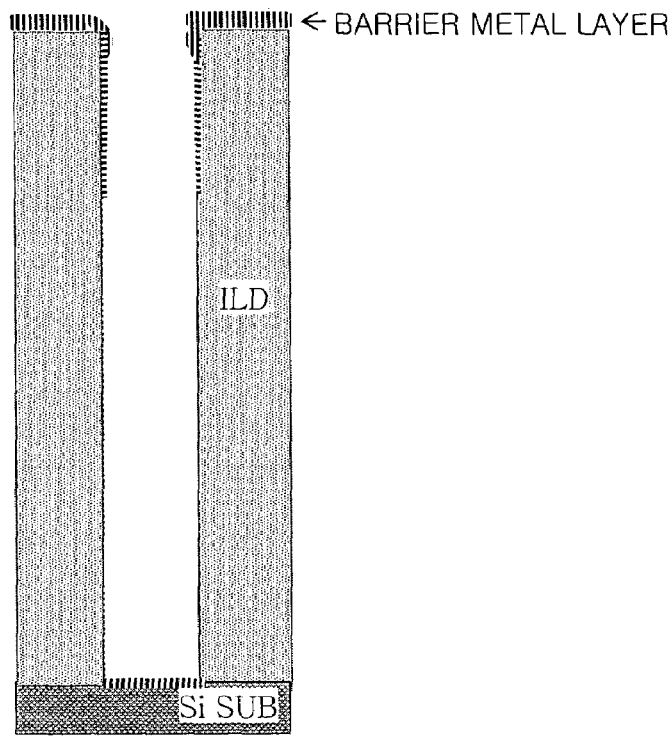
FIG. 4A is a diagram showing a step-coverage characteristic of a barrier metal layer formed on a contact opening of which height is high by employing an ion metal plasma (IMP) method.
Figure 4B:
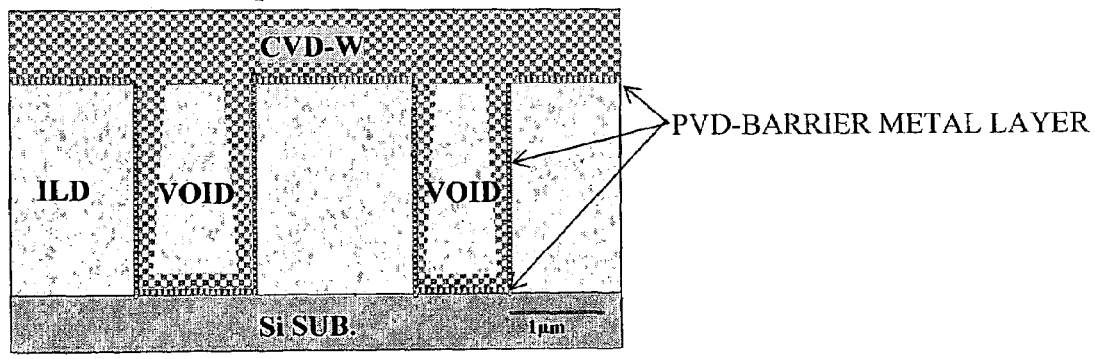
FIG. 4B is a diagram showing a step-coverage characteristic of a metal layer formed on a barrier metal layer, which is formed on a contact opening of which height is low by employing the IMP method, through performing a CVD method.
Figure 5A:
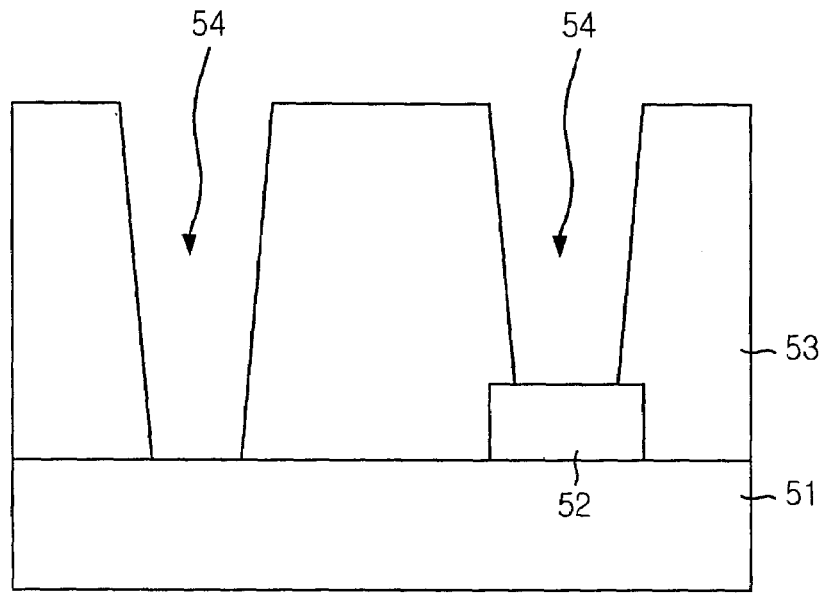
FIGS. 5A to 5G are cross-sectional views illustrating a method for fabricating a metal interconnection line structure in accordance with a first embodiment of the present invention.

Referring to FIG. 5A, an insulation layer 53 is formed on a silicon-based substrate 51 provided with a semiconductor device element 52 such as a gate structure or a bit line. Then, the insulation layer 53 is etched by employing a photolithography process and a dry etching process, thereby obtaining contact openings 54 exposing the substrate 41 and semiconductor device element 52. Herein, the contact openings 54 are contact holes or via holes for connecting the semiconductor device element 52 and the silicon-based substrate 51 with a metal interconnection line. As a scale of integration of a semiconductor device has been increased, a height of each contact opening 54 becomes high and a difference in height between the contact openings 54 becomes pronounced.

After the formation of the contact openings 54, a wet etching process for removing a native oxide layer and remaining impurities on each bottom surface of the contact openings 54 is performed. At this time, the wet etching process proceeds by first dipping the above substrate structure into a bath of sulfuric acid ($H_2SO_4$) for approximately 5 minutes and then into a bath of diluted hydrofluoric acid (HF) for approximately 90 seconds. Herein, a dilution ratio of the hydrofluoric acid with respect to a dilution chemical is approximately 200 to approximately 1.

Next, a dry etching process using a high density plasma with a good directivity is performed to remove the native oxide layer that may remain on the bottom surfaces of the contact openings 54 or a highly polymerized layer containing such material as carbon fluoride (CF) remaining on the bottom surfaces of the contact openings 54 after the dry etching process is precedently performed for forming the contact openings 54.

As described above, if the contact openings 54 are subjected to the two subsequent etching processes, it is possible to maintain the surfaces of the contact openings 54 clean without impurities and the native oxide layer.

Figure 5B:
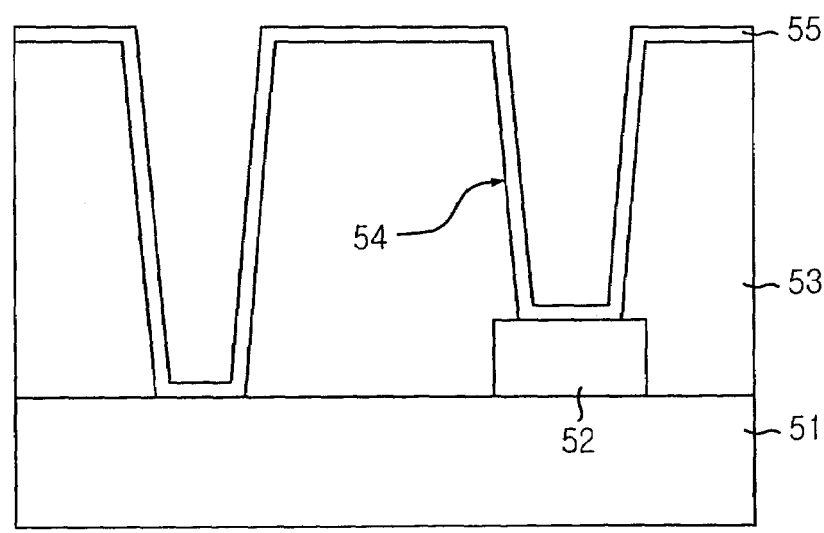

Referring to FIG. 5B, an ohmic metal layer 55 is formed by employing a physical vapor deposition (PVD) method having a poor step-coverage characteristic at sidewalls of the contact opening 54 of which height is high. An ion metal plasma (IMP) method, a long through sputtering (LTS) method and a collimated sputtering method are examples of the PVD method for forming the ohmic metal layer 55. Herein, the ohmic metal layer 55 is preferably made of a material such as titanium (Ti) or titanium nitride (TiN) which serves as a low resistance stabilizing material for lowering a contact resistance. At this time, a thickness of the ohmic metal layer 55 is determined by considering a maximum thickness of the insulation layer 53 and a diameter of the contact opening 54. Also, electrical characteristics such as leakage currents and contact resistance are evaluated to determine an optimal thickness of the ohmic contact layer 55.

Figure 5C:
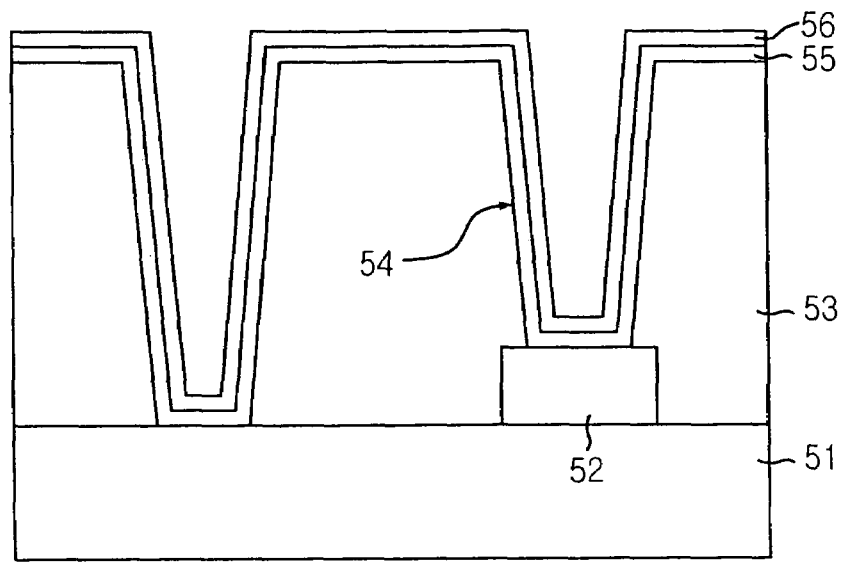

Referring to FIG. 5C, a seed layer 56 for forming a tungsten layer is formed on the ohmic metal layer 55. At this time, the seed layer 56 is one of a silicon layer and a hydrogen containing amorphous silicon (SiH$_x$) layer, where x representing an atomic ratio of hydrogen is in a range of approximately $0 \leq x \leq$ approximately 4.

As an example of forming the amorphous silicon layer as the seed layer 56, the silicon-based substrate 51 is transferred to a chamber and is then heated at a temperature ranging from approximately 400° C. to approximately 500° C. in a vacuum state. Concurrently, Ar and SiH$_4$ gases are flowed into the chamber, and a low pressure state, for instance, in a range from approximately 1 torr to approximately 10 torr, is maintained. Under these maintained conditions, the amorphous silicon layer is formed at a surface reaction region. Since the amorphous silicon layer is formed through a surface reaction, the amorphous silicon layer has a good step-coverage characteristic. Also, a thickness of the seed layer 56 increases depending on time and temperature and is determined by considering a thickness of the above mentioned tungsten layer which is subsequently formed.

Figure 5D:
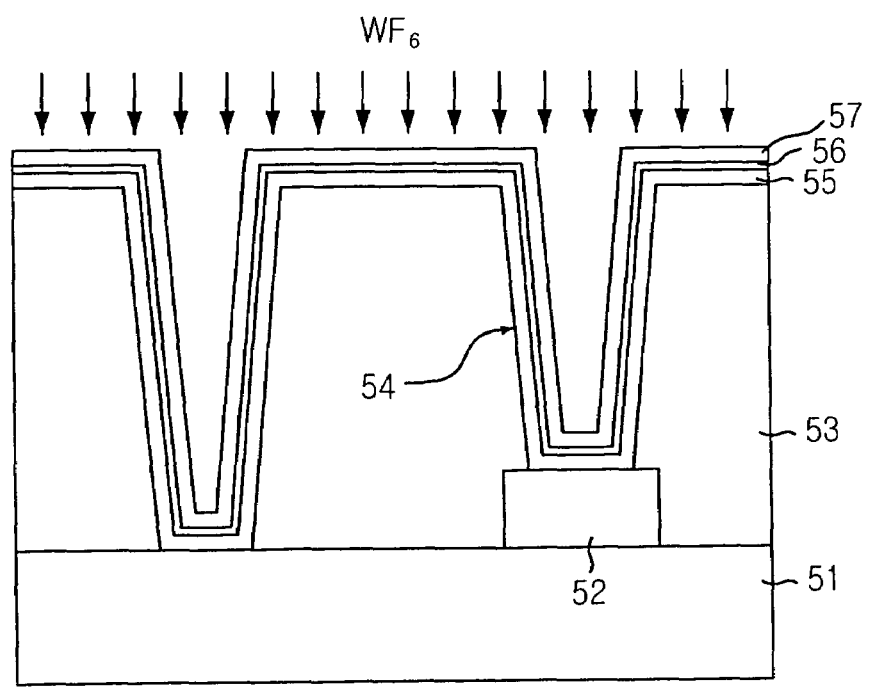

Referring to FIG. 5D, the aforementioned tungsten layer 57 is formed on the seed layer 56 especially by a reduction reaction of silicon. The reduction reaction of silicon for forming the tungsten layer 57 is induced by providing tungsten hexafluoride (WF$_6$) gas to the seed layer 56. This silicon reduction reaction is expressed as follows:

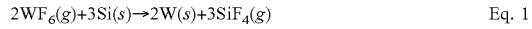

$$2WF_6(g) + 3Si(s) \rightarrow 2W(s) + 3SiF_4(g) \qquad \text{Eq. 1}$$

During the silicon reduction reaction, the silicon existing within a bottom portion of the seed layer 56 is consumed by an amount that is approximately 1.2 to approximately 1.3 times of the thickness of the tungsten layer 57 and, remains with a predetermined thickness after the formation of the tungsten layer 57. Especially, the tungsten layer 57 functions as a glue layer.

Meanwhile, products of the above silicon reduction reaction such as non-reacted WF$_6$, SiF$_4$ and SiHF$_3$ may still remain by being adsorbed on an inner side and a surface of the tungsten layer 57. Thus, the tungsten layer 57 is exposed to a mixed gas of Ar and H$_2$ for a predetermined period in order to remove these adsorbed products.

In case that copper is used as a metal interconnection line material, it is necessary to increase a thickness of the tungsten layer 57 for the purpose of strengthening a diffusion barrier characteristic.

The tungsten layer 57 has a self-limiting characteristic when being disposed on the seed layer 56 although this characteristic varies depending on a process recipe for forming the tungsten layer 57. Thus, the steps of forming the tungsten layer 57 and nitriding the tungsten layer 57 are repeated, thereby obtaining a tungsten nitride (WN) layer.

Figure 5E:
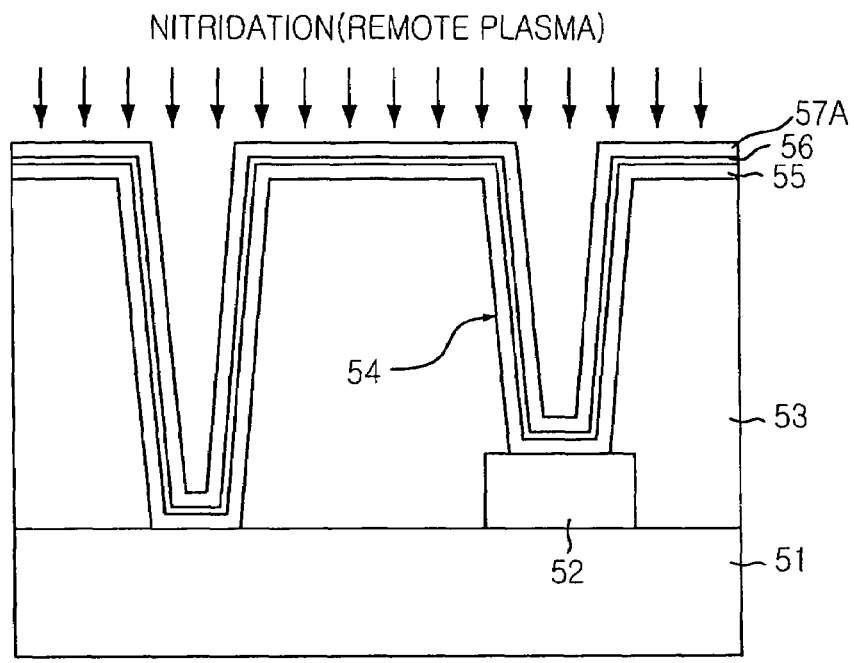

The formation of the tungsten nitride layer 57A will be described in more detail with reference to FIG. 5E.

As shown, the tungsten layer 57 shown in FIG. 5D is formed by the silicon reduction reaction and, is nitrided thereafter. These consecutive steps are repeated to transform the tungsten layer 57 into the above mentioned tungsten nitride layer 57A which is a barrier metal layer. Herein, the tungsten nitride layer 57A serves especially as a diffusion barrier metal layer. At this time, the tungsten layer 57 is nitrided by employing a remote plasma method with use of a gas containing nitrogen such as NH$_3$, N$_2$H$_4$ or N$_2$.

If the tungsten layer 57 is deposited at a temperature greater than approximately 300° C., a deposition rate of the tungsten layer 47 increases rapidly, thereby resulting in a decrease in the density of the tungsten layer 57. For instance, if a total pressure is approximately 0.5 torr at the time of the deposition and, approximately 15 sccm of the WF$_6$ gas and approximately 2 slm of the Ar gas are used, the deposition rate at a temperature of approximately 240° C. is approximately 1.1 nm per minute, but changes to approximately 165 nm per minute at a temperature of approximately 290° C.

As described above, if the deposition rate increases, it is difficult to accurately control a thickness of the barrier metal layer which becomes a consecutive layer type depending on a diameter of the contact opening 54. The desired thickness range of the barrier metal layer is from approximately 2 nm to approximately 30 nm.

In the mean time, if the deposition temperature arises to approximately 450° C., the source gas of WF$_6$ for forming the tungsten layer 57 reacts with the seed layer 56 to form a tungsten silicide (WSix), where x representing an atomic ratio of silicon is less than or equal to approximately 2. The chemical reaction between the source gas and the seed layer 56 is expressed as follows.

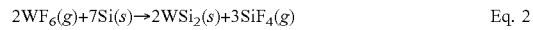

$$2WF_6(g) + 7Si(s) \rightarrow 2WSi_2(s) + 3SiF_4(g) \qquad \text{Eq. 2}$$

The formation of the tungsten silicide layer causes resistivity to increase abruptly. For instance, a resistivity of tungsten is approximately 5 $\Omega$-cm to approximately 10 $\Omega$-cm when tungsten is disposed over a glue layer of titanium nitride/titanium tungsten. Also, when tungsten is disposed on a silicon substrate at a temperature ranging from approximately 236° C. to approximately 292° C., a resistivity of the tungsten is in a range from approximately 31.7 $\mu\Omega$-cm to approximately 114 $\mu\Omega$-cm. However, tungsten silicide has a high resistivity of approximately 500 $\mu\Omega$-cm when being disposed on the silicon substrate at a temperature of approximately 500° C.

Also, in case that a reaction pressure increases, a self-limited thickness of the tungsten layer 57 also increases. For instance, if a reaction pressure increases in order of approximately 0.5 mtorr, approximately 1.0 mtorr and approximately 2.0 mtorr, a self-limited thickness of the tungsten layer 57 changes in order of approximately 18 nm, approximately 32 nm and approximately 60 nm, respectively. At this time, a deposition temperature is approximately 345° C., and approximately 20 sccm of WF$_6$ gas and approximately 2 slm of Ar gas are used.

Since the self-limited thickness of the tungsten layer 57 increases, it is necessary to determine an optimal process recipe by considering various parameters. In more detail of the parameters, during the formation of the seed layer 56, the SiH$_4$ gas is supplied with parameters such as a temperature varying in a range from approximately 400° C. to approximately 500° C., use or non-use of the remote plasma method, a varied exposure time of the SiH$_4$ gas, and then, a change in a deposition rate of the tungsten layer 57 depending on a deposition temperature ranging from approximately 200° C. to approximately 300° C. and a pressure ranging from approximately 1 mtorr to approximately 1 torr is measured. In case of using the remote plasma method, it is possible to form the seed layer 56 at a temperature less than approximately 400° C.

In the step of forming the tungsten nitride layer 57A, i.e., the barrier metal layer, reaction sources can be individually supplied to a reaction chamber in sequence, or an inert gas is supplied for a predetermined period in the middle of supplying each reaction source. Through this special supply of the reaction sources, it is possible to improve step-coverage characteristics of the deposited layers and remove impurities existing within the deposited layers.

Figure 5F:
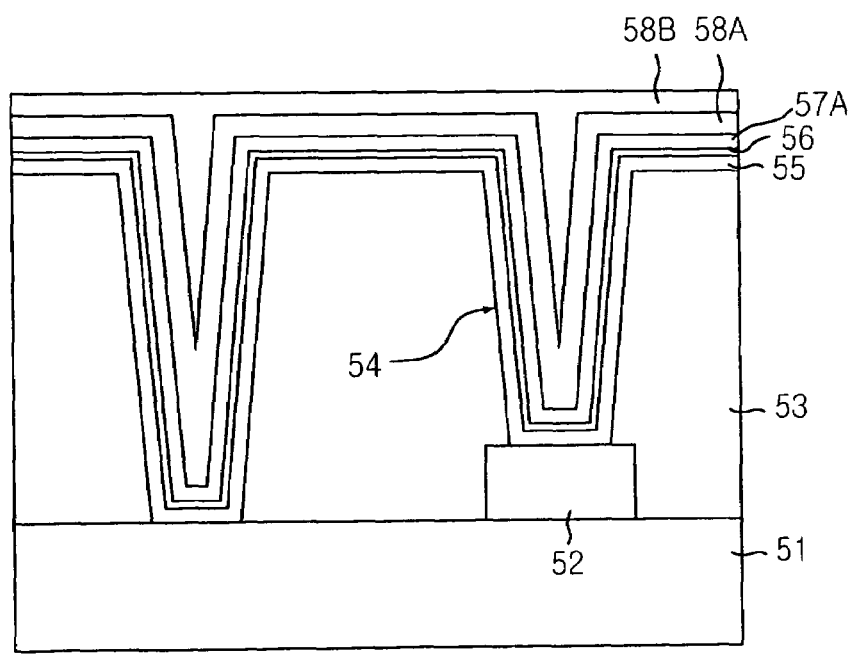

Referring to FIG. 5F, a first aluminum (Al) layer 58A is filled into the openings 54 by employing a typical deposition method providing a good step-coverage characteristic such as chemical vapor deposition (CVD) method or an atomic layer deposition (ALD) method. Then, the first aluminum layer 58A is exposed to the air. At this time, although not illustrated, a native oxide layer is formed on a surface of the first aluminum layer 58A because of this exposure. The native oxide layer is then removed through a physical etching process with use of Ar plasma. If the first aluminum layer 58A is not exposed to the air, this physical etching process can be omitted.

Next, a second aluminum layer 58B is formed on the first aluminum layer 58A by employing a physical vapor deposition (PVD) method. Afterwards, a re-flow process is performed to planarize the second aluminum layer 58B. Herein, the re-flow process proceeds by applying a thermal treatment to the above substrate structure in a vacuum state. Particularly, the thermal treatment proceeds at a temperature ranging from approximately 350° C. to approximately 500° C. for approximately several seconds to several minutes, preferably for approximately 30 seconds to approximately 180 seconds, in an atmosphere of an inert gas such as Ar.

Figure 5G:
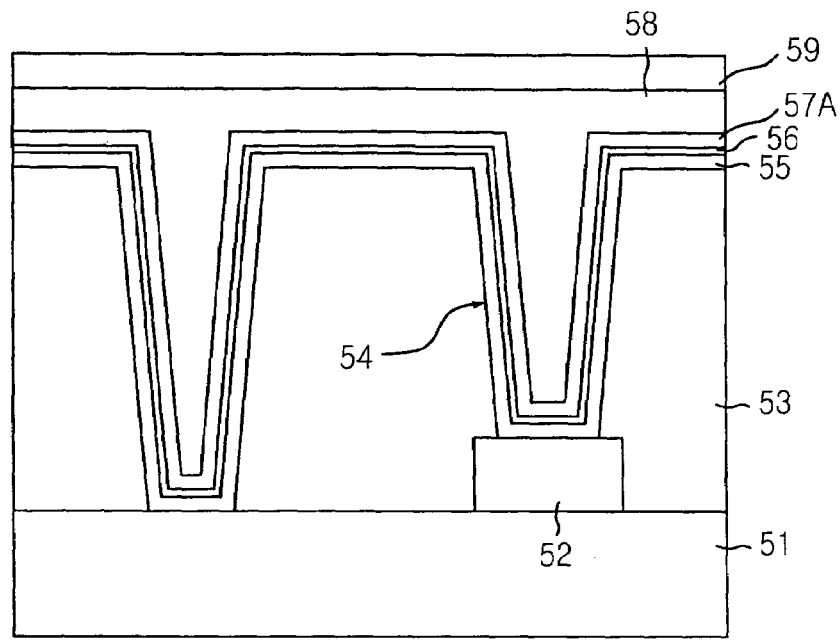

Referring to FIG. 5G, the heat provided to the resulting substrate structure during the re-flow process and the physical etching process for removing the native oxide layer results in the removal of an interface between the first aluminum layer 58A and the second aluminum layer 58B, thereby forming a single layer of an aluminum interconnection line 58. That is, the aluminum interconnection line 58 is formed as aluminums of the first and the second aluminum layers 58A and 58B are flowed to be filled into the openings 54 as simultaneously as an upper surface of the aluminum interconnection line 58 is planarized because of the re-flow process.

As described above, since the aluminum interconnection line 58 is originated from the first aluminum layer 58A which is formed through a grain growth, the aluminum interconnection line 58 has an improved crystalline quality.

After the formation of the aluminum interconnection line 58, an anti-reflective coating layer 59 is formed on the aluminum interconnection line 58 by employing a PVD method. At this time, the anti-reflective coating layer 59 is made of a material such as titanium and titanium nitride and can be formed in a single layer of this selected material or in stacked layers of these materials.

In accordance with the first embodiment of the present invention, instead of using tungsten as a material for forming the interconnection line, e.g., a plug, aluminum is used along with employing the CVD method. In case of employing a predetermined process for forming the aluminum interconnection line and performing this predetermined process in a temperature greater than an interface reaction initiation temperature, the tungsten layer is heated to a temperature (T) in a range of approximately 400° C.≦T≦ approximately 500° C. without being exposed to the air and is then subjected to the remote plasma process with use of a predetermined gas such as $NH_3$ or $N_2$, so that the tungsten layer is transformed into the tungsten nitride ($WN_x$), where x representing an atomic ratio of nitrogen is less than or equal to approximately 2. At this time, the tungsten nitride layer serves as the barrier metal layer for preventing aluminum of the subsequently formed aluminum interconnection line from diffusing and reacting with the bottom layers disposed beneath the aluminum interconnection line.

Meanwhile, for the burial of the first aluminum layer into the contact openings by employing the CVD method, it is possible to form the first aluminum layer only on the tungsten nitride layer by using a selective growth characteristic of an aluminum compound such as dimethylaluminum hydride (DMAH) or methylpyrrolidine alane (MPA) that is formed only on a conductive material. Therefore, the first aluminum layer is formed at a temperature ranging from approximately 250° C. to approximately 400° C. and at a pressure ranging from approximately 1 torr to approximately 10 torr.

The use of aluminum compound having the above mentioned selective growth characteristic discomposes organic compounds in a low temperature as the aluminum compound diffuses into the substrate. As a result, there is provided an effect of preventing or minimizing a decrease in device yields caused by particles generated by an unstable reaction through controlling a process recipe that causes the decrease in device yields.

Accordingly, conventionally used aluminum compounds that do not have the selective growth characteristic such as trimethyl aluminum (TMA), triisobutyl aluminum (TIBA) and dimethyl ethylamine alane (DMEAA) may bring out nucleus generation on the insulation layer except for the barrier metal layer because of a characteristic of a reaction gas that is decomposed in vapor while the metal plug, e.g., the aluminum interconnection line, is formed selectively inside of the contact openings on which the barrier metal layer is formed. Also, when the metal plug is formed consecutively on an entire surface of the substrate structure, which is prepared by forming the barrier metal layer on the contact openings, without being exposed to the air, the device yields still decrease because of the particle generation regardless of an employed deposition method.

Figure 6:
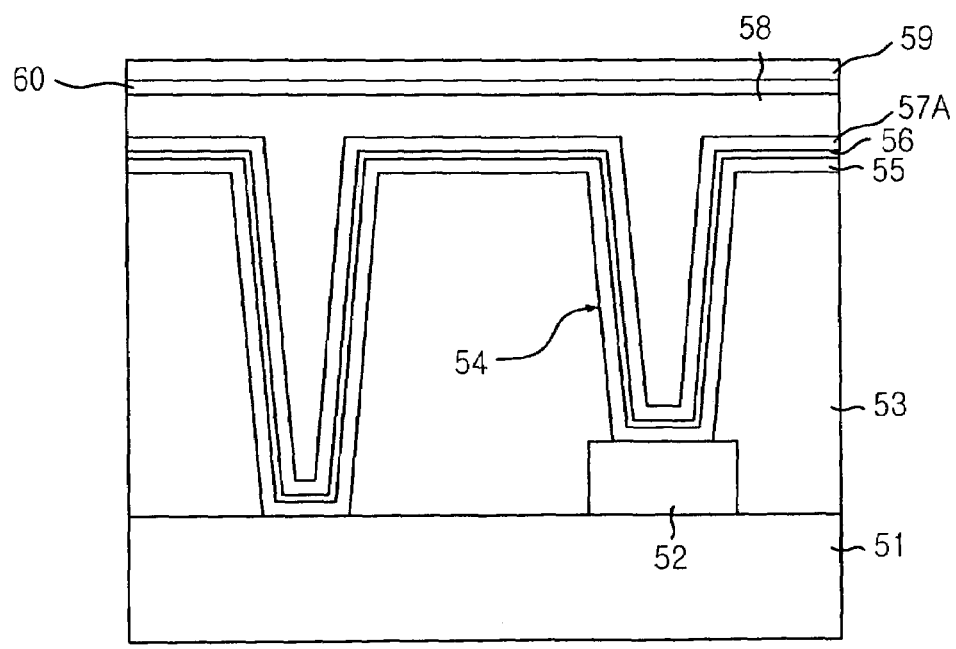
FIG. 6 is a cross-sectional view of a metal interconnection line structure in accordance with a second embodiment of the present invention.

FIG. 6 is a cross-sectional view showing a metal interconnection line in accordance with a second embodiment of the present invention. Herein, the same reference numerals denoted in the first embodiment are used for the same configuration elements in this drawing, and formation of such configuration elements will not be described in detail.

Particularly, in addition to the use of the aluminum layer 58 as the plug for filling contact openings 54 as described in the first embodiment, the second embodiment exemplifies the use of the aluminum layer 58 as an interconnection line.

As shown in this drawing, the aluminum layer 58 is formed on a barrier metal layer 57A by performing a CVD method. Herein, the barrier metal layer is made of tungsten nitride and is formed in a low temperature along with a good step-coverage characteristic. Also, in addition to the CVD method, the aluminum layer 58 can be formed by employing an ALD method or multi-sequential steps of supplying reaction gases alternately.

Next, a copper layer 60 is formed on the aluminum layer 58 by employing the same method as mentioned above. At this time, the copper layer 60 is not exposed to the atmosphere, and a thickness of the copper layer 60 is determined by considering an intended amount of copper to be implanted into the aluminum layer 58. Then, copper atoms are dispersed within the aluminum layer 58, and in order to improve reliability by a grain growth, a thermal process is carried out at a chamber maintained in a vacuum state and in an atmosphere of an inert gas such as Ar for a predetermined period. While the thermal process is carried out, the aluminum layer 58 is planarized.

Afterwards, an anti-reflective coating layer 59 is formed on the copper layer 60 and the planarized aluminum layer 58, thereby obtaining a planarized metal interconnection structure with a good reliability.

If it is necessary to add impurity such as silicon capable of improving tolerance to electric disconnection of a metal interconnection line caused by a stress exerted to the metal interconnection line, a compound containing silicon is sequentially added with hydrogen gas and an inert gas during depositing the tungsten nitride layer 57A and then the aluminum layer 58. In this case, a concentration of the silicon that can be contained within the aluminum layer 58 is low during a subsequent thermal process, and thus, a trace amount of the silicon becomes diffused while most of the silicon remains by agglomerating together within the tungsten nitride layer 57A.

Figure 7:
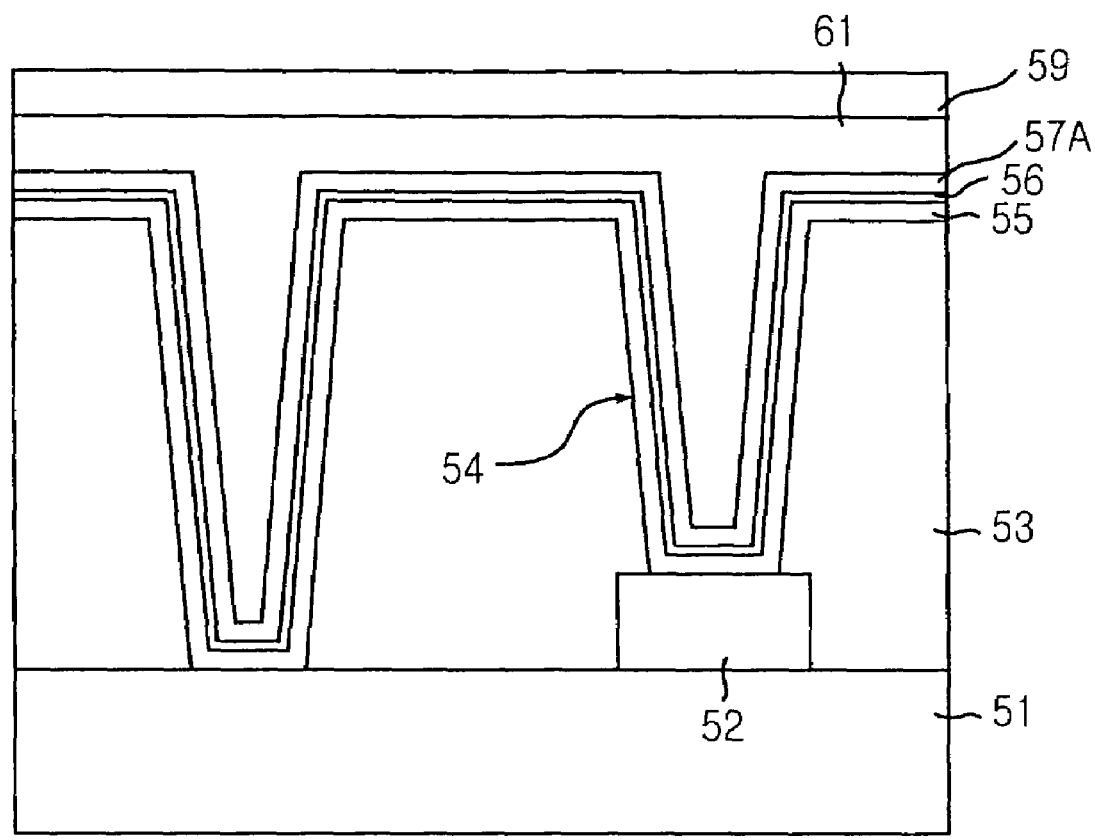
FIG. 7 is a cross-sectional view of a metal interconnection line structure in accordance with a third embodiment of the present invention.

FIG. 7 is a cross-sectional view showing a metal interconnection line structure in accordance with a third embodiment of the present invention. Particularly, in the third embodiment, a copper layer having the lowest resistance with respect to an interconnection line is formed on a barrier metal layer, i.e., a tungsten nitride layer deposited in a low temperature. Also, in this third embodiment, the same reference numerals appearing in the first and the second embodiments are used for the same configuration elements.

As shown, being different from the second embodiment wherein the aluminum layer is used to fill contact openings as simultaneously as to form a metal interconnection line, a copper layer 61 is formed on a tungsten nitride layer 57A which is a barrier metal layer by employing a CVD method, and then an anti-reflecting coating layer 59 is formed on the copper layer 61.

Since copper is highly diffusible, the steps of forming an amorphous silicon layer, forming a tungsten layer and performing a nitridation process to the tungsten layer are repeated in several times to prevent an incidence of copper diffusion caused by thermal energy applied to a substrate 51 during subsequent processes for forming a multi-layered interconnection line structure.

At this time, a thickness of the tungsten nitride layer 57A or the number of repeating the above sequential steps may vary because of a difference in temperature of the subsequent thermal process depending on an applied semiconductor device. Therefore, it is necessary to determine the optimal thickness and the number of repeating steps of forming the tungsten nitride layer 57A for each applied semiconductor device.

In case of forming the above mentioned tungsten nitride layer 57A serving as the barrier metal layer and having a good step-coverage characteristic on another barrier metal layer 55 made of Ti or TiN formed by a PVD method, a barrier characteristic against the copper diffusion is improved by a non-consecutive layer, formed between the above two barrier metal layers 57A and the 55, and a difference in crystal lattice of these two barrier metal layers 57A and 55. For this reason, it not necessary to repeat the steps of forming a metal layer and nitriding the metal layer for the purpose of strengthening the barrier layer. That is, it is possible to form the metal layer and nitride the metal layer with intended thicknesses in one step. As described above, the tungsten nitride layer 57A has a good barrier characteristic against the copper diffusion, and thus, when the tungsten nitride layer 57A has a thickness of approximately 8 nm, it is possible to prevent the copper diffusion up to a temperature of approximately 600° C. for approximately 30 minutes. In case that the tungsten nitride layer 57A has a thickness of approximately 25 nm, it is possible to prevent the copper diffusion up to a temperature of approximately 790° C. for approximately 30 minutes.

As a gas providing a selective growth characteristic such as Cu(hfac)TMVS is supplied along with Ar gas to a heated substrate 51 at a reaction chamber, a blanket deposition characteristic is observed since the copper used for forming the metal interconnection line is uniformly deposited on a bottom surface, sidewalls and a top surface of each contact opening 54 through performing a CVD method. Herein, the hfac and TMVS of the Cu(hfac)TMVS are the abbreviations of hexafluoroacetylacetonate and trimethylvinylsilane, respectively. That is, because of a time variably taken for initiating generation of nuclei caused by a poor step-coverage characteristic, the bottom surface, sidewalls and top surface of each contact opening show different step-coverage characteristics from each other. This non-uniform step-coverage characteristic is described in detail in FIGS. 8A and 8B.

Figure 8A:
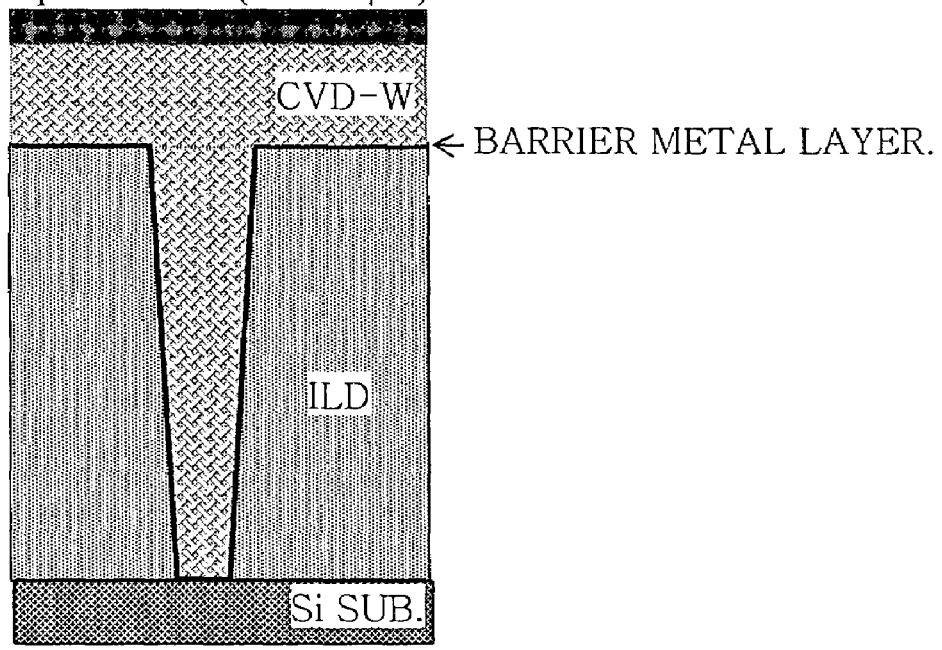
FIG. 8A is a diagram depicting a step-coverage characteristic of a barrier metal layer formed in a low temperature in accordance with the present invention.

Especially, FIG. 8A is a diagram depicting a step-coverage characteristic of a barrier metal layer deposited in a low temperature.

As shown, when the barrier metal layer is formed on a contact opening of which height is high, e.g., an aspect ratio of approximately 7 and a critical dimension of approximately 0.3 µm, in a low temperature. At this time, when a thickness of the barrier metal layer is approximately 5 nm, it is shown that the barrier metal layer has a good step-coverage characteristic.

For instance, a tungsten layer is deposited on the barrier metal layer by employing a CVD method in order to test the step-coverage characteristic of the barrier metal layer formed on an amorphous silicon layer at a temperature less than approximately 400° C. through a selective growth condition. As shown in this drawing, the contact opening is filled with the aluminum layer without creating gaps.

Figure 8B:
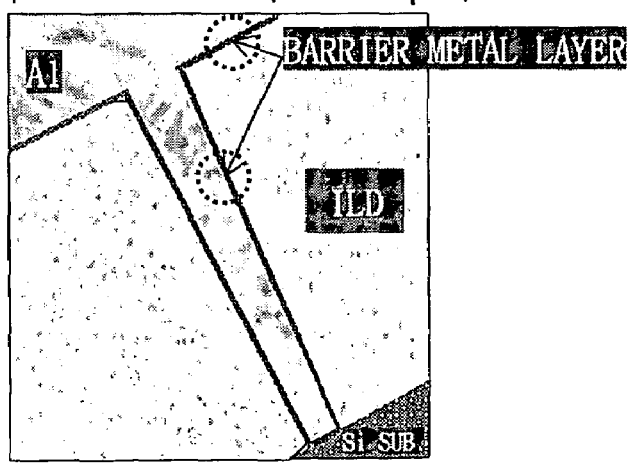
FIG. 8B is a diagram depicting a step-coverage characteristic of an aluminum interconnection line formed on a barrier metal layer deposited in a low temperature in accordance with the present invention.

FIG. 8B is a diagram depicting a step-coverage characteristic of an aluminum interconnection line formed on a barrier metal layer deposited in a low temperature.

As shown, an aluminum-based organic compound material having a selective growth characteristic on the barrier metal layer is completely filled into a contact opening of which height is high, e.g., an aspect ratio of approximately 20 and a critical dimension of approximately 0.3 µm.

With use of the above described barrier metal layer having a good step-coverage characteristic can be applied to a single or dual damascene process.

Figure 9A:
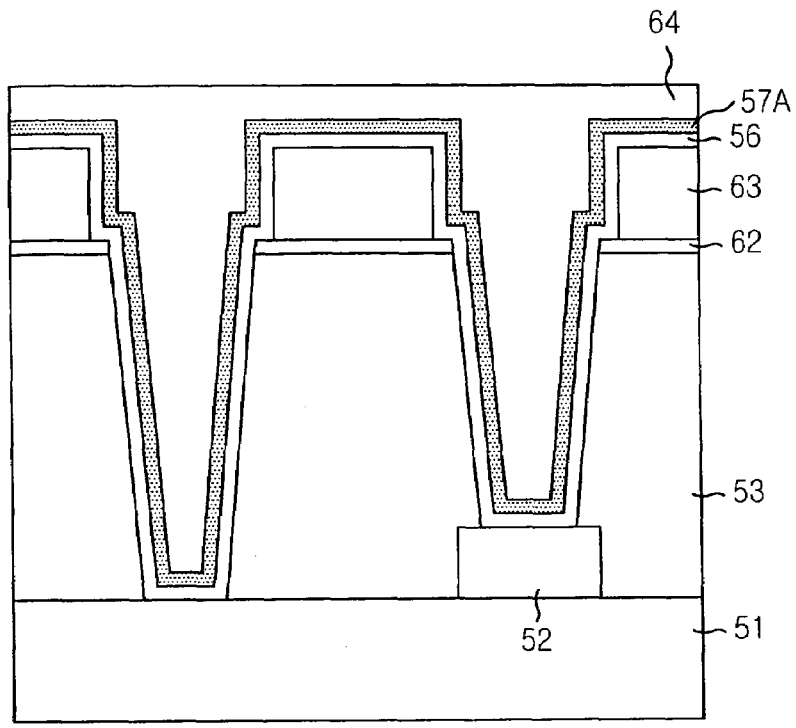
FIGS. 9A and 9B are cross-sectional views illustrating a method for forming a metal interconnection line with use of a dual damascene method in accordance with the present invention.
Figure 9B:
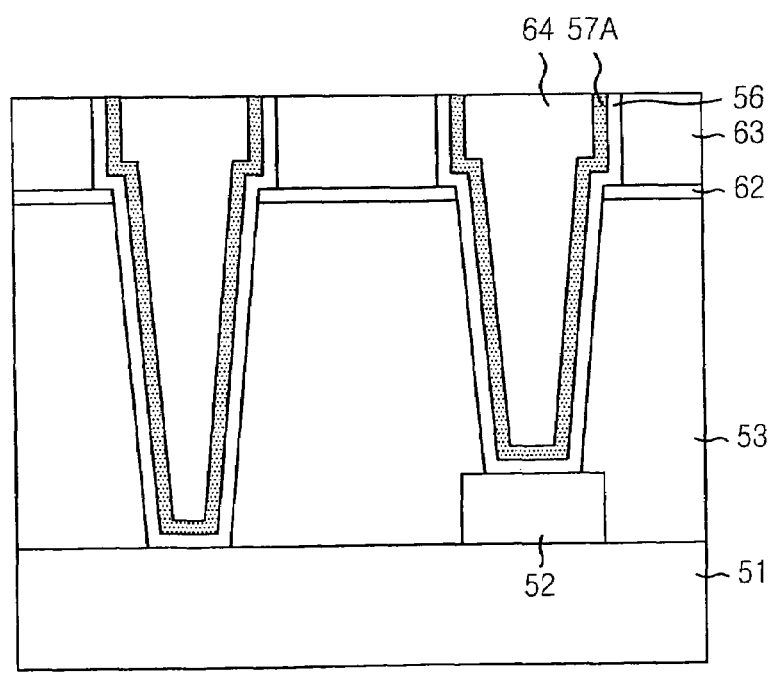

FIGS. 9A and 9B are cross-sectional views illustrating a method for fabricating a method for forming a metal interconnection line with use of a damascene process. Herein, the same reference numerals described through the first embodiment to the third embodiment are used for the same configuration elements.

Referring to FIG. 9A, a dual damascene structure is formed by employing a typical method. That is, a first insulation layer 53, an etch barrier layer 62 and a second insulation layer 63 are sequentially formed on a substrate 51 provided with a precedently formed a device element 42 such as a gate structure or a bit line. Then, the second insulation layer 63 is etched to form a trench in which an interconnection line will be formed, and then, the first insulation layer 43 is etched to form the above mentioned contact openings (not shown) on which plugs will be formed. Afterwards, a seed layer 56 and a barrier metal layer 57A are sequentially formed on the above resulting substrate structure.

Next, a metal layer 64 having a low value of resistivity is formed by employing a CVD method with use of a compound providing a selective deposition characteristic with respect to bottom layers beneath the metal layer 64. Herein, the metal layer 64 is formed by using a material such as copper or aluminum. Through this CVD method, it is possible to form the metal layer 64 uniformly on the substrate 51, the contact opening (not shown) and the device element 52 without generating particles.

Referring to FIG. 9B, a chemical mechanical polishing (CMP) process and a cleaning process are performed. At this time, the metal layer 64 is planarized until having a height lower than the second insulation layer 63.

Although not illustrated, a thermal process for re-crystallizing the metal layer 64 is carried out, and then, another metal barrier layer can be formed only on the exposed metal layer 64 by repeating the steps of selectively forming another metal layer and nitriding said another metal layer.

Also, the present invention exemplifies the use of tungsten as the metal layer; however, the metal layer can be made of a materials selected from molybdenum (Mo) and refractory metals that induce a reduction reaction of the seed layer.

In accordance with the above described embodiments of the present invention, the metal layer capable of serving as barrier metal layer is uniformly formed on an entire surface of the prepared substrate structure having a difference in height at a temperature less than approximately 400° C. by using a surface reaction induced through providing reaction gases in sequential steps and a selective deposition characteristic of the metal layer appearing depending on a type and a state of the bottom layers formed beneath the metal layer. As a result, it is possible to reduce device installation costs compared with the case of the blanket deposition of an aluminum layer and a subsequent etching process, and also costs related to plant equipment investment can be reduced by employing conventionally used PVD and CVD apparatuses.

Further, the number of steps to form the plug and the interconnection line is decreased, thereby increasing yields and productivity of semiconductor devices.

Additionally, in the multi-layered interconnection line structure having a high aspect ratio, since the burial of the contact opening and the formation of the interconnection line can be formed regardless of a location of the metal interconnection line, it is possible to reduce manufacturing costs and yields of semiconductor devices by being applied to a product fabrication technology regardless of a trend of continuous minimization.

The present application contains subject matter related to the Korean patent application No. KR 2004-0032847, filed in the Korean Patent Office on May 10, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a metal interconnection line in a semiconductor device, comprising the steps of:
    forming an inter-layer insulation layer on a substrate;
    etching predetermined regions of the inter-layer insulation layer to form a plurality of contact openings;
    forming an ohmic metal layer on the contact openings and the etched inter-layer insulation layer;
    forming a seed layer on the ohmic metal layer;
    depositing the metal layer on the seed layer through the use of a surface reaction induced by a reduction of the seed layer;
    nitriding the metal layer repeatedly using a remote plasma method to form a barrier metal layer; and
    forming a metal interconnection line on the barrier metal layer by burying the contact openings.

2. The method of claim 1, wherein the step of nitriding the metal layer proceeds by providing a nitrogen containing gas selected from a group consisting of $NH_3$, $N_2H_4$ and $N_2$.

3. The method of claim 1, wherein the metal layer is made of tungsten.

4. The method of claim 1, wherein the barrier metal layer is made of tungsten nitride.

5. The method of claim 1, wherein the step of forming the metal layer proceeds at a temperature ranging from approximately 200° C. to approximately 300° C. and a pressure ranging from approximately 1 mtorr to approximately 1 torr.

6. The method of claim 1, wherein the metal layer is formed by using one of molybdenum and a refractory metal inducing a reduction reaction of the seed layer.

7. The method of claim 1, wherein the seed layer is a silicon layer.

8. The method of claim 1, wherein the step of forming the seed layer and the barrier metal layer proceeds by sequentially providing reaction sources in a separate step.

9. The method of claim 1, wherein the step of forming the seed layer and the barrier metal layer proceeds by providing an inert gas for a predetermined period between an interval of providing reaction sources in a separate step.

10. The method of claim 1, further including the step of forming an anti-reflective coating layer.

11. The method of claim 1, wherein the seed layer is a hydrogen containing amorphous silicon layer.

12. The method of claim 7, wherein the seed layer is formed by heating the substrate at a temperature ranging from approximately 400° C. to approximately 500° C. as simultaneously as by providing a gas containing silicon to the heated substrate.

13. The method of claim 11, wherein the seed layer is formed by heating the substrate at a temperature ranging from approximately 400° C. to approximately 500° C. as simultaneously as by providing a gas containing silicon to the heated substrate.

14. The method of claim 1, wherein the step of forming the metal interconnection line includes the steps of:
    forming a first aluminum layer by employing one of a chemical vapor deposition method and an atomic layer deposition method;
    forming a second aluminum layer by employing a physical vapor deposition method; and performing a re-flow process to the first and the second aluminum layers.

15. The method of claim 14, wherein at the step of forming the first aluminum layer, a reaction source is one of dimethylaluminum hydride (DMAH) and methylpyrrolidine alane (MPA).

16. The method of claim 1, wherein the step of forming the metal interconnection line includes the steps of:
    forming an aluminum layer by employing a chemical vapor deposition method until the aluminum layer is filled into the contact openings;
    forming a copper layer on the aluminum layer; and
    implanting copper atoms into the aluminum layer.

17. The method of claim 16, wherein the step of forming the copper layer proceeds by using a reaction source of [Cu(hfac)TMVS].

18. The method of claim 1, wherein the step of forming the metal interconnection line includes the step of forming a copper layer on the barrier metal layer by employing a chemical vapor deposition method.

19. The method of claim 18, wherein the step of forming the copper layer proceeds by using a reaction source of [Cu(hfac)TMVS].

* * * * *